US005512335A

United States Patent [19]
Miller et al.

[11] Patent Number: 5,512,335
[45] Date of Patent: Apr. 30, 1996

[54] FLUID TREATMENT DEVICE WITH VIBRATIONAL ENERGY MEANS

[75] Inventors: Thomas L. Miller, Vestal; Richard F. Nelson, Apalachin; John K. Ostrom, Binghamton, all of N.Y.

[73] Assignee: International Business Machines Corporation, Armonk, N.Y.

[21] Appl. No.: 267,060

[22] Filed: Jun. 27, 1994

[51] Int. Cl.[6] .................................................. B06B 1/00
[52] U.S. Cl. ...................... 427/600; 427/601; 118/410; 118/411; 118/429; 134/1; 134/184; 134/186
[58] Field of Search .................................. 427/600, 601, 427/434.5; 118/411, 429, 410; 134/1, 184, 186

[56] References Cited

U.S. PATENT DOCUMENTS

| | | | |
|---|---|---|---|
| 4,042,725 | 8/1977 | Nomaki et al. | 427/601 |
| 4,501,285 | 2/1985 | Irwin et al. | 134/58 |
| 4,649,060 | 3/1987 | Ishikawa et al. | 427/601 |
| 4,849,769 | 7/1989 | Dressler | 346/1.1 |
| 4,979,994 | 12/1990 | Dussault et al. | 134/1 |
| 5,037,208 | 8/1991 | Dussault et al. | 366/127 |
| 5,063,951 | 11/1991 | Bard et al. | 134/64 |
| 5,148,823 | 9/1992 | Bran | 134/184 |
| 5,203,798 | 4/1993 | Watanabe et al. | 134/184 |
| 5,289,639 | 3/1994 | Bard et al. | 34/12 |
| 5,368,902 | 11/1994 | Todd et al. | 427/601 |

FOREIGN PATENT DOCUMENTS 4-344462  12/1992  Japan ................................. 427/600

OTHER PUBLICATIONS

IBM Technical Disclosure Bulletin, vol. 27, No. 11, Apr. 1985, "Wave Soldering By Ultrasonically Induced Acoustic Streaming", Backes et al., p. 6395.
3-44927 Japan Abstract Feb. 26, 1991.
4-206636 Japan Abstract Jul. 28, 1992.

*Primary Examiner*—Shrive Beck
*Assistant Examiner*—Katherine A. Bareford
*Attorney, Agent, or Firm*—Lawrence R. Fraley

[57] ABSTRACT

A fluid treatment device and method for treating moving substrates with fluid as the substrates move through the device at a relatively high rate of travel. Fluid injection in combination with the application of vibration energy (e.g., ultrasonic) results in enhanced fluid treatment of the substrates. In one embodiment, a bifurcated horn is utilized in combination with fluid injector members having pluralities of rows of spaced injector ports, the injectors being strategically positioned relative to the vibrational source. In one example, the device and method may be used for enhanced penetration by dye materials of ceramic substrate surfaces to detect adverse surface conditions (e.g., cracks) and thus potentially defective product.

14 Claims, 4 Drawing Sheets

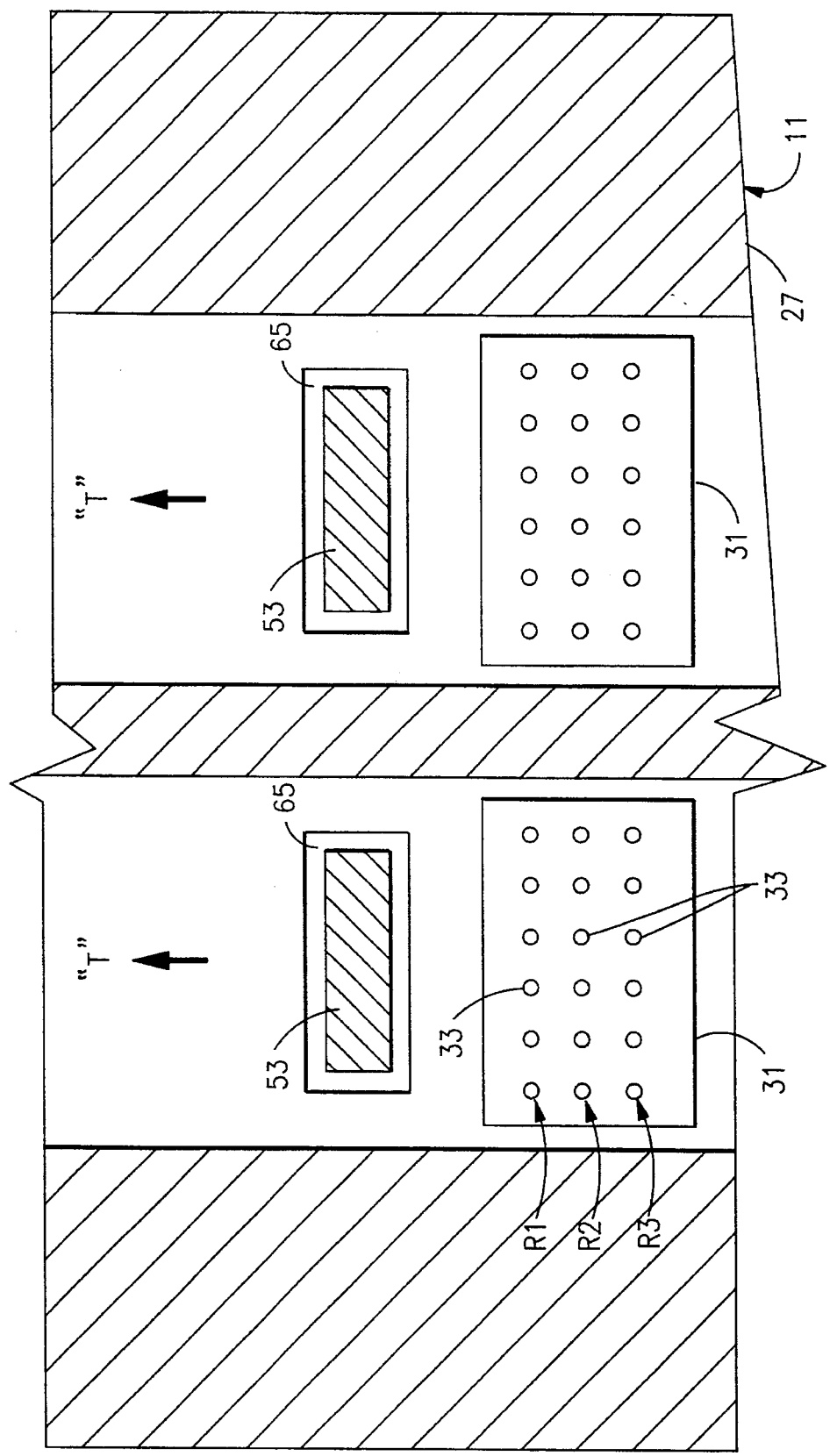

FLUID TREATMENT DEVICE WITH VIBRATIONAL ENERGY MEANS

TECHNICAL FIELD

The invention relates to fluid treatment devices and particularly to those which are adapted for treating articles such as substrates or the like as the articles pass through the device. Even more particularly, the invention is related to such devices wherein vibrational, e.g., ultrasonic, energy is imparted as a means for enhancing the treatment process performed by the device.

BACKGROUND OF THE INVENTION

There are several known devices designed for the treatment of substrates (e.g., those used as base elements for such electronic components as ceramic modules, printed circuit boards, etc.) and the like. Examples are shown in U.S. Pat. Nos. 4,142,010 (Pipkin et al.), 4,152,153 (Jackson et al.), 4,299,186 (Pipkin et al.), 4,387,124 (Pipkin) and 4,836,133 (Wohrle). See also International Business Machines (IBM) Corporation Technical Disclosure Bulletin (TDB) Vol. 23, No. 4 (Sept. 1980) at pages 1362 and 1363. More recent examples are defined in U.S. Pat. Nos. 5,063,951 (Bard et al.) and 5,289,639 (Bard et al.), both assigned to the assignee of the present invention. With particular regard to U.S. Pat. No. 5,289,639, a fluid jet injector member is defined which includes strategically positioned apertures (jet injectors) for directing fluid jets onto a designated substrate. It will be understood from the following that the injector members taught in U.S. Pat. No. 5,289,639 may be used in the present invention. U.S. Pat. No. 5,289,639 is thereby incorporated herein by reference.

In addition to the above, there are known such fluid treatment devices wherein ultrasonic energy is utilized, e.g., to enhance the treatment process. Examples are shown in U.S. Patent Nos. 4,501,285 (Irwin et al.), 4,849,769 (Dressier), 4,979,994 (Dussault et al.), 5,037,208 (Dussault), 5,148,823 (Bran) and 5,203,798 (Watanabe et al.). Ultrasonic vibration is also described in IBM TDB Vol. 27, No. 11 (April, 1985), page 6395 (wave soldering), and in the following published Japanese documents: (1) JA 0044927 (Feb. 1991), Appl. No. 64-181025 (semiconductor substrate cleaning); and (2) JP 404206636 (July 1992), Appl. No. 2-330177 (semiconductor device cleaning). In such devices, the ultrasonic source (e.g., transducer) has typically been secured to (and thus operatively connected to) the fluid container to cause vibration thereof or has been immersed in a container of substantially stationary fluid.

By the term treatment (or treating) of substrates as used herein is meant to include functions such as coating, cleaning, chemical reaction, as well as others such as plating. One particular use of the invention is to facilitate dye or the like chemical penetration into cracks or other imperfections as might occur in relatively delicate articles such as ceramic substrates. The invention is adaptable to a wide variety of diverse processes and is not limited to the above, however. The term fluid as used herein is meant to include liquids, and is of course not limited to dyes.

As defined herein, the invention involves the use of fluid which flows across the substrate (e.g., ceramic base members) at predetermined rates as the substrate moves through the invention at a relatively high rate of travel. Significantly, the invention is able to incorporate the use of vibrational energy (e.g., ultrasonic) to particularly direct this energy onto the moving fluid at a relatively precise location on the substrate to enhance treatment thereof. As stated, one example of such treatment may involve the penetration of the ceramic by dye material to indicate the presence of imperfections (e.g., cracks) in the surfaces thereof. Clearly, however, the invention is readily adaptable for use in several other processes involving moving fluids and associated substrates. Significantly, the invention provides such enhanced treatment utilizing a partly submerged vibrational structure (e.g., ultrasonic horn) that is not physically connected to the invention's housing but instead substantially only exposed to the moving fluid. The invention thus does not require (or desire) housing vibration.

It is believed that a fluid treatment device and method having the advantageous features cited herein and otherwise discernible from the instant teachings would represent a significant advancement in the art.

DISCLOSURE OF THE INVENTION

It is a primary object of the invention to enhance the art of treating articles with fluids.

It is another object of the invention to provide a fluid treatment device of relatively simple and inexpensive construction which can be operated in a facile manner.

It is yet another object of the invention to provide such a device and process which are both readily adaptable to mass production.

In accordance with one aspect of the invention, there is provided a fluid treatment device comprising a housing defining at least one chamber therein, means for providing a fluid to the chamber of the housing such that the fluid will move through the chamber and be maintained within the chamber at an established level, means for moving a substrate through the chamber of the housing such that the substrate will be exposed to the fluid moving within the chamber for a predetermined time period, and means for providing vibrational energy to the fluid moving within the chamber to enhance the treatment of the substrate by the fluid. The means for providing vibrational energy is adapted for being partly submerged within the fluid within the chamber and also for being located relative to the substrate as the substrate moves through the chamber, the means for providing vibrational energy not being in physical contact with the housing.

In accordance with another aspect of the invention, there is provided a method of treating a substrate with fluid. The method comprises the steps of providing a housing defining a chamber therein, providing fluid to the chamber of the housing at a predetermined rate such that the fluid will move through the chamber and be maintained at an established level within the chamber, moving a substrate through the chamber of the housing at a preestablished rate such that the substrate will be exposed to the fluid moving within the chamber for a predetermined time period, and providing vibrational energy to the fluid moving within the chamber to enhance the treatment of the substrate by the fluid. The vibrational energy is provided by partly submerging the means for providing the vibrational energy within the fluid and activating the means while so partly submerged and while maintaining this means in a non-contacting relationship with the housing.

BRIEF DESCRIPTION OF THE DRAWINGS

FIG. 4 is a partial plan view of the device of FIG. 1 as taken along the line 4—4 in FIG. 1, FIG. 4 being on a much larger scale than the view in FIG. 1.

BEST MODE FOR CARRYING OUT THE INVENTION

For a better understanding of the present invention, together with other and further objects, advantages and capabilities thereof, reference is made to the following disclosure and appended claims in connection with the above described drawings.

Figure 1:
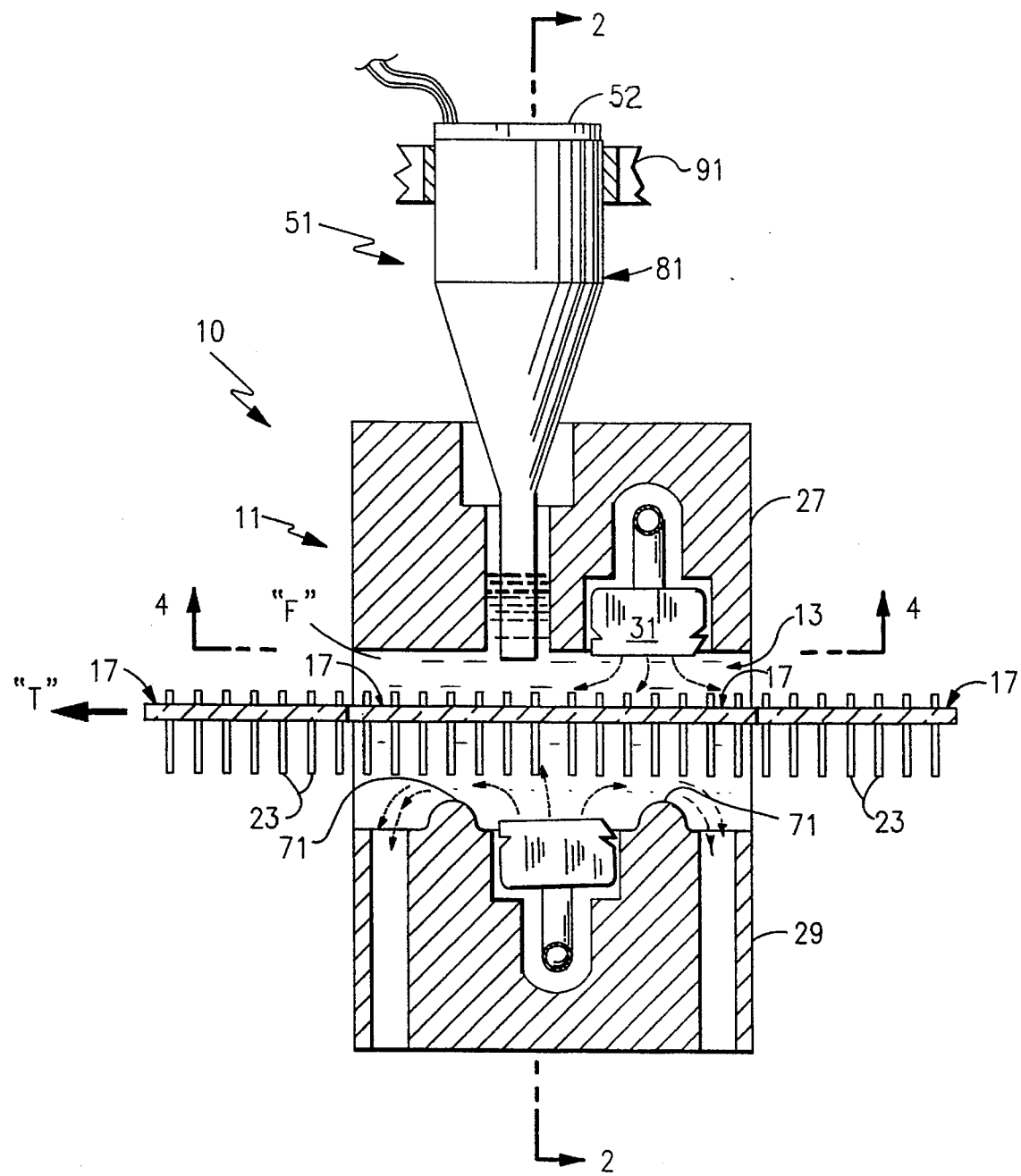
FIG. 1 is a side elevational view, in section, of a fluid treatment device in accordance with one aspect of the invention.
Figure 2:
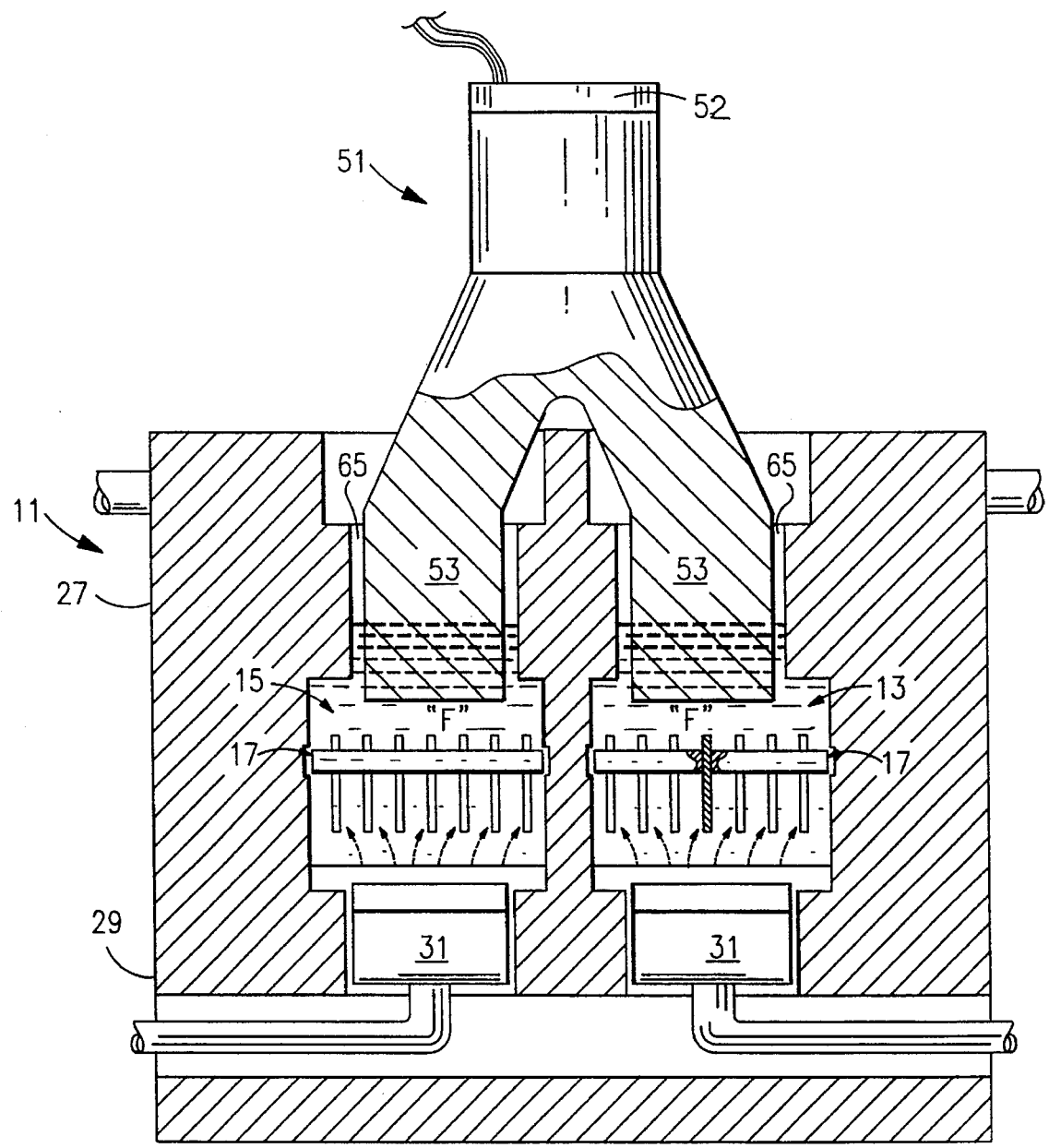
FIG. 2 is a front elevational view of the device of FIG. 1 as taken along the line 2—2 in FIG. 1.

In FIG. 1, there is shown a fluid treatment device 10 in accordance with a preferred embodiment of the invention. Device 10 includes a housing 11 which defines at least one chamber 13 therein. Preferably, housing 11 includes two adjacently disposed chambers 13 and 15 as shown in FIG. 2 (chamber 15 not seen in FIG. 1) in order to accommodate at least two separate substrates 17 and thereby provide simultaneous treatment thereof. In the broader aspects of the invention, however, it is understood that device 10 need only include one such chamber.

In a preferred embodiment, device 10 is designed for simultaneously treating two lines of substrates each moving through the device in sequential manner. In one embodiment, device 10 is particularly adapted for treating ceramic-based substrates as used in microelectronic structures (e.g., for use in information handing systems). Such ceramic substrates (17) include a ceramic substrate body 21 (FIG. 3) having one or more layers of circuitry (not shown) thereon. In the particular embodiments in the drawings, these substrates further include a plurality of conductive pins (e.g., copper) 23 as part thereof, these pins positioned within the ceramic base in accordance with a predetermined pattern and extending therefrom for eventual positioning within an associated substrate (e.g., printed circuit board). The configuration for substrate 17 as shown herein is not meant to limit the invention, however, in that several other types of substrates, including printed circuit boards of organic dielectric material having conductive circuitry thereon, may also be successfully treated by the invention.

Figure 3:
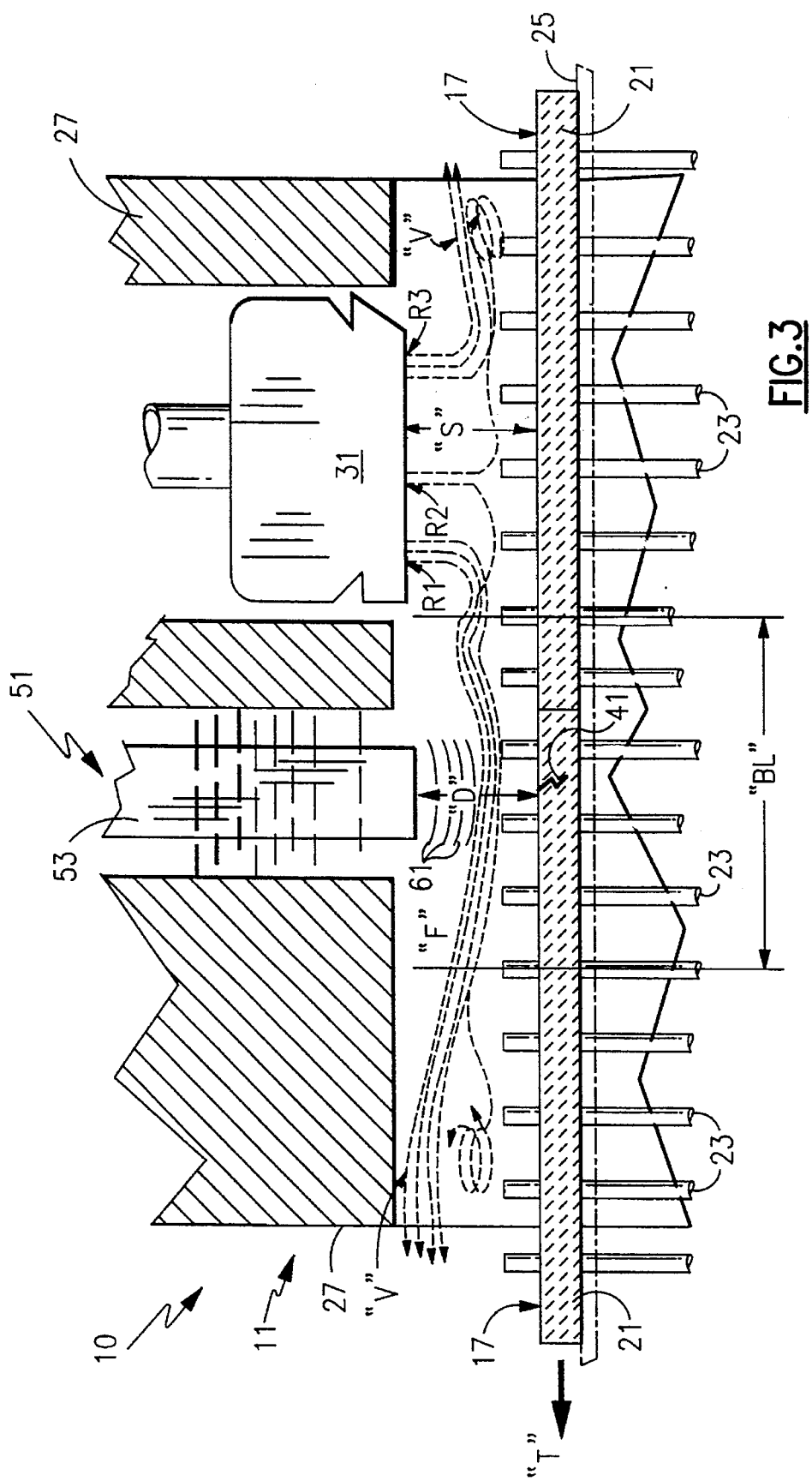
FIG. 3 is a partial, side elevational view, of the device of FIG. 1 on a much enlarged scale over the view in FIG. 1.

In FIG. 3, two contiguous substrates 17 are shown moving through device 10 in a singular direction ("T") . In FIG. 2, it is understood that one such substrate from each of the individual lines is shown, these moving in a direction toward tile viewer. In FIG. 1, four contiguous substrates are moved (direction "T") for treatment by device 10. It is understood, of course, that a similar number of substrates are being treated in the other line (not shown in FIG. 1) running substantially parallel to that shown.

One means for moving substrates 17 through device 10 may comprise an individual track 25 (shown in phantom in FIG. 3) or similar conveyor means for having the individual substrates seated thereon. Various additional means for providing this transport of the substrates through device 10 are well within the capabilities of those skilled in the art and further definition is not believed necessary. Track 25 is not shown in FIGS. 1, 2 and 4.

Housing 11, as seen in FIG. 1, preferably includes both upper and lower head portions 27 and 29. By the term head portion as described herein is meant to include a part of the housing wherein fluid application means (e.g., the injectors to be defined in greater detail hereinbelow) will be incorporated. Although housing 11 is shown in FIG. 2 to represent a substantially solid, integral unit having portions 27 and 29, it is understood that in the broader aspects of the invention, head portions 27 and 29 may constitute separate structures located at a predetermined spacing from each other. The invention is not limited, therefore, to the particular structure in FIG. 2.

As will be defined herein, the present invention is particularly adapted for treating the substrates wherein high mass transfer reaction rates, controlled fluid flow and compactness of design are attained. That is, the invention as defined herein provides a compact structure which optimizes utilization of the fluids to provide enhance processing of substrates and other elements being treated by the invention. The invention is thus deemed to constitute a significant advancement in the art over known, prior devices.

To achieve the above, device 10 preferably utilizes at least one fluid injector member 31 located within housing 11 relative to each of the lines of travel by substrates 17. Thus, in the dual line structure herein, two such fluid injector members 31 (see FIG. 4) are preferably utilized. Each of these upper injector members 31 is preferably located immediately adjacent the means for providing vibrational energy (to be described in greater detail hereinbelow) along the path of travel ("T"). In one example, these injector members were positioned a distance of only about 0.250 inch from the adjacent vibrational means. Additionally, the upper injector members 31 are preferably spaced at a distance ("S" in FIG. 3) of only about 0.050 inch from the upper surface of the moving substrates 17.

In accordance with the preferred teachings of the invention, each of the injector members 31 used herein is preferably of the type defined in U.S. Pat. No. 5,289,639 (Bard et al.), assigned to the assignee of the present invention. Accordingly, U.S. Pat. No. 5,289,639 is incorporated herein by reference. As taught therein, each of these fluid injector members includes a plurality of strategically positioned injector ports 33 (FIG. 4), aligned in individual rows (3 longitudinal rows shown per injector in FIG. 4) for directing fluid onto the designated substrates (as shown in FIG. 3). The three separate rows of such ports provide the three streams of fluid as represented in FIG. 3. These three rows (R1, R2 and R3) are represented in both FIGS. 3 and 4. As seen in FIG. 4, these rows are oriented substantially perpendicular to the direction of travel ("T") for the substrates passing through device 10. As seen in FIG. 3, these rows of ports also direct the fluid from the injector member 31 in a direction substantially perpendicular to the planar upper surface of the substrates. Use of the injectors as defined in U.S. Pat. No. 5,289,639 thus provides the invention with the several advantages of such a structure.

It is to be understood that the invention is not limited, however, to the use of the injector members described in the foregoing patent. It is within the scope of the invention to utilize other forms of fluid injection means for providing pressurized fluid into device 10 and still satisfactorily accomplish the treatment of substrates 17. Such fluid injection is preferred in comparison to the use of standard dipping and spray arrangements, for the reasons cited in the specification of U.S. Pat. No. 5,289,639.

As seen in FIGS. 1 and 2, two fluid injector members 31 are also utilized within the lower portion 29 of housing 11, each for a respective one of the substrate lines. These injectors are preferably positioned a distance of about 0.250 inch from the undersurface of the substrates being subjected to the fluid therefrom. Preferably, these injectors are also located such that the three rows of injector ports are substantially perpendicular to the direction of travel "T" of the substrates and also for substantially directing the fluid therefrom in a perpendicular manner toward these substrates. The flow lines in FIGS. 1 and 2 are thus for illustrative purposes only.

In one aspect of the invention, device 10 was utilized for surface analyses of the ceramic bodies of substrates 17. Specifically, the preferred fluid is a dye material, one example being available under the trade name Scanning Compound 38, from Angstrom Technologies, Inc. of Erlanger, Ky. This material, when mixed with deionized water is specifically designed for penetrating cracks 41 (FIG. 3) or other surface irregularities within the ceramic material to permit ease of detection thereof (e.g., by ultraviolet light, microscope inspection, etc.) at a subsequent work station. Effective penetration is thus essential in order to properly determine the presence of any such defects, which could possibly adversely affect the resulting operation of the electronic component in which the respective substrate is utilized. In the preferred method for such detection, two steps are utilized. In the first, fluid having dye therein is used with the substrates passed therethrough. Ultrasonics assure surface penetration. In a second step, the treated substrates are exposed to a second fluid device (including possibly device 10 once the dye material is removed) wherein deionized water is used as the fluid. Ultrasonics are again used, this time to assure complete rinse of the substrates' external surfaces. The dye as initially provided remains in the surface cracks, but are more discernible at this time because of the complete removal of the surface material during the second rinse step. The invention thus assures both effective penetration and excess material removal (by rinsing) to thereby assure enhanced crack or other irregularity detection. Obviously, these substrates with unacceptable irregularities are rejected as scrap.

The above dye material (or use of such material) is not meant to limit the invention, however, in that device 10, as stated above, may be used to perform several different types of processes (e.g., etching, plating, etc.).

In accordance with the teachings of the present invention, device 10 utilizes vibrational energy for the purpose of enhancing the above fluid processing (treatment) of substrates such as those illustrated herein. Such energy is provided to the respective chambers 13 and 15 and, as understood, is substantially localized within these chambers, with one significant exception (as noted below).

In a preferred embodiment, the means for providing vibrational energy for device 10 comprises an ultrasonic horn 51 which, as shown in FIGS. 1 and 2, is suspended from above housing 11 such that two projecting end portions 53 thereof are submerged within the fluid ("F"). As seen in FIGS. 1–3, fluid "F" is maintained at an established level well above the substrates 17. Horn 51, being a transducer assembly, has as part thereof, at least one piezoelectric wafer 52 which is operatively connected to the horn body portion (81) and in turn electrically coupled to a suitable power source (not shown) such that the wafers are adapted for being excited by electrical high frequency voltage so as to be rendered resonant to in turn cause the solid horn to propagate ultrasonic wave energy in the form of a plurality of continuous ultrasonic wave fronts 61 (FIG. 3) directly toward the upper surfaces of substrate 17. The rapidly changing pressure gradient produced by these ultrasonic waves accelerates the dye's ability to penetrate the ceramic. In a preferred embodiment, ultrasonic energy of a frequency of from about 10 kHz to about 50 kHz was utilized at power ratings up to about 600 watts. In one example, a frequency of 20 kHz at 50 watts of power was successfully utilized. Significantly, the ultrasonic wave energy is incident upon the planar upper surfaces of the substrates at an angle of substantially 90°, and the projecting end portions 53 of horn 51 are positioned relatively close to these surfaces. In one example, this distance ("D" in FIG. 3) was only about 0.040 inch. In FIG. 3, it is seen that waves 61 serve to substantially compress fluid "F" in the region immediately adjacent the substrate's upper surface which in turn is located immediately below the respective projecting end portion 53 of horn 51.

Of particular significance, it is noted that horn 51 is not located in physical contact with the internal walls or other portions of housing 11 of device 10. Rather, the horn 51 is only submerged (partly) within the fluid and does not physically contact any part of the invention's housing or other elements. The illustrated chambers and adjacent openings through which projecting ends of the bifurcated horn 51 are extended allow for this spaced positioning from the internal surfaces. The provided spacing is considered critical to assure maximum transmission of energy to the fluid "F" and processing chambers 13 and 15 without significant loss to the housing structure.

The height of the cavity and the corresponding height of the fluid maintained within housing 11 is considered critical to effective operation of the invention. The rise height (head pressure) stabilizes when balanced with the chamber pressures. This feature is considered important. In one example, fluid rose to a height of only about 0.250 inches about horn 51, which would equate to a relatively low pressure. The fluid pressure supplied by the pump (not shown) supplying the fluid was about 20 to 45 psi. This is significant with respect to use of fluid head (injector) devices such as defined in U.S. Pat. No. 5,289,639, because such devices have proven to operate most effectively at low pressures. In addition to the illustrated internal side walls of each chamber, the illustrated fluid height is maintained by additional walls or fluid blocking end plates (not shown), well within the scope of the art and not further illustrated or described here. With respect to the lower injector members 31, weirs 71 are provided on opposite sides of each lower member for assisting in collecting and maintaining fluid at the prescribed level. The aforementioned walls or other blocking means are also utilized such that the fluid is maintained to a level at this portion of the invention in contact with the undersurface of the substrates. The fluid thus substantially and entirely fills the open portion of housing 11 shown in FIG. 1 between the opposed injector members 31. In one embodiment, an input pressure for the fluid "F" of about 45 psi was utilized to successfully accomplish dye penetration of potentially defective substrates 17 having ceramic body thicknesses of about 0.060 inch.

With particular attention to FIGS. 1 and 2, horn 51 is shown as including the aforementioned body portion 81 having the also aforementioned piezoelectric element 52 at one end thereof. The defined projecting end portions, of substantially rectangular, cross-sectional configuration (FIG. 4) downwardly project from this body portion. As seen in the drawings, horn 51 is substantially solid. A preferred material for horn 51 is stainless steel or titanium. A preferred material for housing 11 is polycarbonate (e.g., Lexan, a trademark of General Electric Company).

Horn 51 is preferably suspended within housing 11 from a frame structure 91 (partly shown in FIG. 1). Other suitable suspension means may, of course, be used for this purpose and further description is not believed necessary.

Significantly, the tapered configuration of the substantially cylindrical horn body portion 81 and the corresponding configuration for the projecting end portions 53 allow the horn to "focus" its ultrasonic energy in the specific direction within each chamber required for maximum effectiveness.

Surprisingly, utilization of only one horn, positioned as shown, resulted in effective dye penetration of both upper and lower surfaces of each ceramic substrate in a device of the configuration as defined herein. This is considered very significant because it minimizes the number of parts required for the invention, as well as conserves energy in the operation thereof.

In one embodiment, the substrates 17, when treated with the above fluid and at the pressures identified, moved through housing 11 at a relatively high rate of travel. In one example, this rate was within the range of from about one to about three inches per second. It is thus seen that device 10 is particularly adapted for mass production.

In FIG. 3, it is seen that end portion 53 focuses the ultrasonic energy onto substrate 17 at the aforementioned distance from the adjacent upper injector member 31. It was determined through analysis that maximum substrate treatment occurred at this location of the injected fluid within housing 11 relative to injector 31. Significantly, this occurs prior to turbulent flow of the fluid as occurs in regions of the fluid known as the vortex regions. These vortex regions are represented by the letter "V" in FIG. 3. More specifically, the vibrational energy is focused at a location of the fluid referred to as a boundary layer represented by the dimension "BL" in FIG. 3. This results in more aggressive chemical action by the fluid subjected to horn 51.

Thus there has been shown and described a fluid treatment device possessing the several highly advantageous features cited above. As stated, the device is readily adaptable for use with a variety of fluids, including etchants, caustic solutions, water, etc. The device as described is of relatively simple construction and can thus be produced at relatively minor costs. Further, the device as described is readily adaptable for use in mass production, thereby even further reducing the cost of manufacture associated therewith.

While there have been shown and described what at present considered the preferred embodiments of the invention, it will be obvious to those skilled in the art that various changes and modifications may be made therein without departing from the scope of the invention as defined by the appended claims. For example, it is possible, with minor modification, to use the invention for such processes as plating. This could be readily accomplished by placement of suitable electrodes within one/both of the head members at strategic locations relative to the location of the substrate to receive such plating. It is also possible to incorporate various means (e.g., heating elements) within the head member(s) (e.g., near the upper surface) if it is desired to raise the fluid temperature to a specified level. Further, various sensing devices (e.g., thermal, sonic) may be incorporated within the invention's head member(s) to monitor selected activities near the head's surface. Finally, it is also possible to combine various fluids (e.g., to provide special chemical properties) and pass these through each/both of the fluid directing means of the invention.

What is claimed is:

1. A method of treating a substrate with fluid, said method comprising:

providing a housing defining a chamber therein;

providing fluid to said chamber of said housing at an established rate using fluid injection such that said fluid will move through said chamber and be maintained at an established level within said chamber, said fluid being injected within said chamber on opposite sides of a substrate;

moving said substrate through said chamber of said housing at an established rate such that said substrate will be exposed to said fluid moving within said chamber for an established time period; and providing vibrational energy to said fluid moving within said chamber, said vibrational energy being provided by partly submerging means for providing said vibrational energy within said fluid and activating said means while so partly submerged and while maintaining said means for providing said vibrational energy in a non-contacting relationship with said housing.

2. The method of claim 1 further including directing said fluid through said chamber at said established rate substantially between said means for providing said vibrational energy and said substrate.

3. The method of claim 1 wherein said vibrational energy is provided to said fluid at a frequency of from about 10 kHz to about 50 kHz.

4. The method of claim 1 wherein said established rate of said substrate movement is from about one to about three inches per second.

5. A fluid treatment device comprising:

a housing defining at least one chamber therein;

means for providing a fluid to said chamber of said housing such that said fluid will move through said chamber and be maintained within said chamber at an established level, said means for providing said fluid including at least one fluid injector member having a plurality of fluid injector ports for having said fluid pass therethrough into said chamber;

means for moving a substrate through said chamber of said housing in a first direction such that said substrate will be exposed to said fluid moving within said chamber for an established time period; and means for providing vibrational energy to said fluid moving within said chamber, said means for providing vibrational energy adapted for being partly submerged within said fluid within said chamber and being located adjacent said substrate as said substrate moves through said chamber, said means for providing vibrational energy not being in physical contact with said housing, said fluid injector member of said means for providing said fluid to said chamber being located substantially immediately adjacent said means for providing said vibrational energy and adapted for substantially directing at least some of said fluid to a location between said substrate and said means for providing said vibrational energy such that said fluid will move through said location at an established rate.

6. The device according to claim 5 wherein said fluid injector member includes a plurality of rows of said injector ports, said rows being oriented substantially perpendicular to said direction of motion of said substrate through said chamber of said housing.

7. The device according to claim 5 wherein means for providing said vibrational energy comprises an ultrasonic horn.

8. The device according to claim 5 wherein said ultrasonic horn provides said vibrational energy onto said substrate in a focused manner.

9. The device according to claim 8 wherein said horn includes first and second projecting end portions, both of said end portions adapted for being at least partly submerged within said fluid maintained at said level within said chamber of said housing.

10. The device according to claim 9 wherein said horn further includes a body portion of substantially tapered configuration, said projecting end portions projecting from said body portion, said body portion not being submerged within said fluid.

11. The device according to claim 10 wherein said housing includes at least two chambers therein, each of said chambers adapted for having a separate substrate pass therethrough, each of said projecting end portions of said ultrasonic horn being located within said housing such that each of said end portions will be positioned within a respective one of said chambers adjacent a respective one of said substrates as said substrates move through said chambers.

12. The device according to claim 5 wherein said means for moving said substrate moves said substrate at a rate of travel through said chamber within the range of from about one to about three inches per second.

13. The device according to claim 5 further including a second fluid injector member located within said housing such that said second fluid injector member will be located on an opposite side of said substrate from the other of said fluid injector members as said substrate moves through said chamber.

14. The device according to claim 13 wherein said housing includes at least one weir portion located relative to said second fluid injector member and adapted for having the fluid provided by said second fluid injector member pass thereover.

* * * * *